(12) United States Patent
Harris et al.

(10) Patent No.: US 9,913,415 B2
(45) Date of Patent: Mar. 6, 2018

(54) EMI SHIELDING TEXTILE FABRIC, WRAPPABLE SLEEVE CONSTRUCTED THEREFROM AND METHOD OF CONSTRUCTION THEREOF

(71) Applicant: Federal-Mogul Powertrain, Inc., Southfield, MI (US)

(72) Inventors: David A. Harris, Coatesville, PA (US); Cassie M. Malloy, Blue Bell, PA (US); Danny Winters, Downingtown, PA (US)

(73) Assignee: Federal-Mogul Powertrain LLC, Southfield, MI (US)

( * ) Notice: Subject to any disclaimer, the term of this patent is extended or adjusted under 35 U.S.C. 154(b) by 1042 days.

(21) Appl. No.: 13/801,633

(22) Filed: Mar. 13, 2013

(65) Prior Publication Data
US 2014/0262478 A1   Sep. 18, 2014

(51) Int. Cl.
*D03D 15/00*   (2006.01)
*H05K 9/00*    (2006.01)
(Continued)

(52) U.S. Cl.
CPC ............. *H05K 9/009* (2013.01); *D02G 3/441* (2013.01); *D03D 1/0035* (2013.01);
(Continued)

(58) Field of Classification Search
CPC .... H05K 9/009; D03D 1/0088; D03D 1/0035; D03D 15/02; D03D 15/04;
(Continued)

(56) References Cited

U.S. PATENT DOCUMENTS

| 5,819,811 A | 10/1998 | Baker et al. |
| 5,843,542 A | 12/1998 | Brushafer et al. |

(Continued)

FOREIGN PATENT DOCUMENTS

| CN | 1092728 C | 10/2002 |
| CN | 1679120 A | 10/2005 |

(Continued)

OTHER PUBLICATIONS

Soller Composites, 2004.*
(Continued)

*Primary Examiner* — Camie S Thompson
(74) *Attorney, Agent, or Firm* — Robert L. Stearns; Dickinson Wright, PLLC

(57) ABSTRACT

A textile fabric, sleeve formed therefrom, and methods of construction thereof are provided. The fabric forms an elongate wall constructed from lengthwise extending warp yarns woven with widthwise extending weft yarns. At least some of the warp yarns are electrically conductive and have a first diameter. The weft yarns have a second diameter that is at least 25 percent less than the first diameter of the warp yarns. As such, the conductive warp yarns are brought into closer proximity with one another than if the weft yarns were the same diameter as the warp yarns. Accordingly, the ability of the fabric and sleeve formed therewith to provide shielding protection against EMI is enhanced.

17 Claims, 4 Drawing Sheets

(51) Int. Cl.
  *D02G 3/44* (2006.01)
  *D03D 1/00* (2006.01)
  *D03D 13/00* (2006.01)
  *D03D 15/02* (2006.01)
  *D03D 15/04* (2006.01)

(52) U.S. Cl.
  CPC ......... *D03D 1/0058* (2013.01); *D03D 13/004* (2013.01); *D03D 15/0027* (2013.01); *D03D 15/0094* (2013.01); *D03D 15/02* (2013.01); *D03D 15/04* (2013.01); *D10B 2101/20* (2013.01)

(58) Field of Classification Search
  CPC ............. D03D 15/0094; D03D 1/0058; D03D 15/0027; D10B 2101/20; D02G 3/441; D01B 2101/20
  USPC ...... 428/208–210, 34.1–36.92; 442/208–210
  See application file for complete search history.

(56) References Cited

U.S. PATENT DOCUMENTS

| | | | |
|---|---|---|---|
| 6,632,753 B1 | 10/2003 | Beasley, Jr. | |
| 7,576,286 B2 * | 8/2009 | Chen | 174/117 M |
| 7,690,401 B2 | 4/2010 | Okuno et al. | |
| 7,874,184 B2 | 1/2011 | Malloy et al. | |
| 8,263,504 B2 | 9/2012 | Bouillon et al. | |
| 2004/0081411 A1 | 4/2004 | Gladfelter et al. | |
| 2009/0159149 A1 | 6/2009 | Karayianni | |
| 2010/0084179 A1 | 4/2010 | Harris et al. | |
| 2010/0124862 A1 | 5/2010 | Smith | |
| 2012/0037263 A1 | 2/2012 | Malloy | |

FOREIGN PATENT DOCUMENTS

| | | | |
|---|---|---|---|
| CN | 101461013 A | | 6/2009 |
| CN | 102560824 A | | 7/2012 |
| EP | 0153823 | | 9/1985 |
| JP | 2010-098019 | * | 4/2010 |
| WO | WO2005/051230 | | 6/2005 |
| WO | 2006102579 A2 | | 9/2006 |
| WO | 2009053872 A1 | | 4/2009 |

OTHER PUBLICATIONS

Mat Web, Dupont, Nomex, 450 Aramid Fiber, accessed online Mar. 6, 2017.*

International Search Report dated Jul. 15, 2014 (PCT/US2014/018535).

* cited by examiner

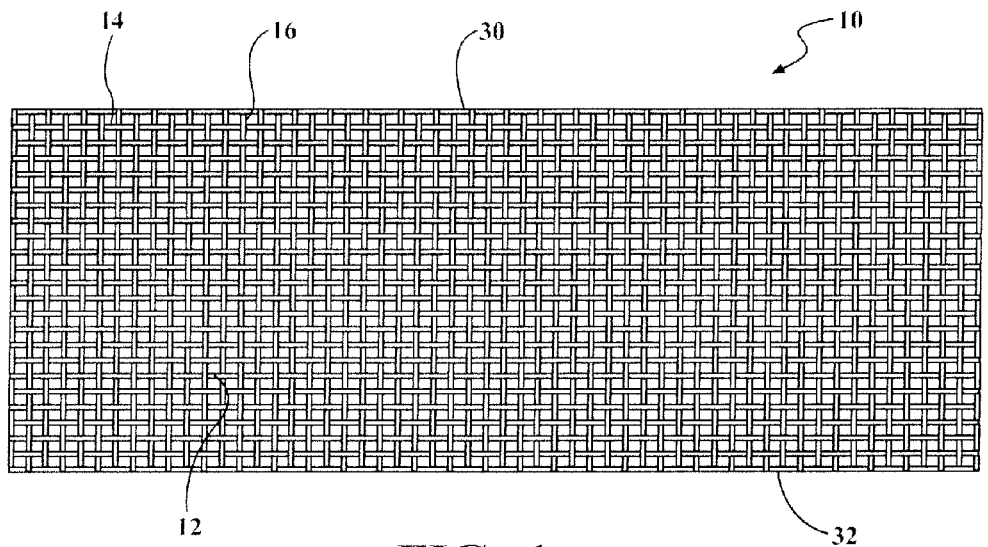
FIG. 1
FIG. 2
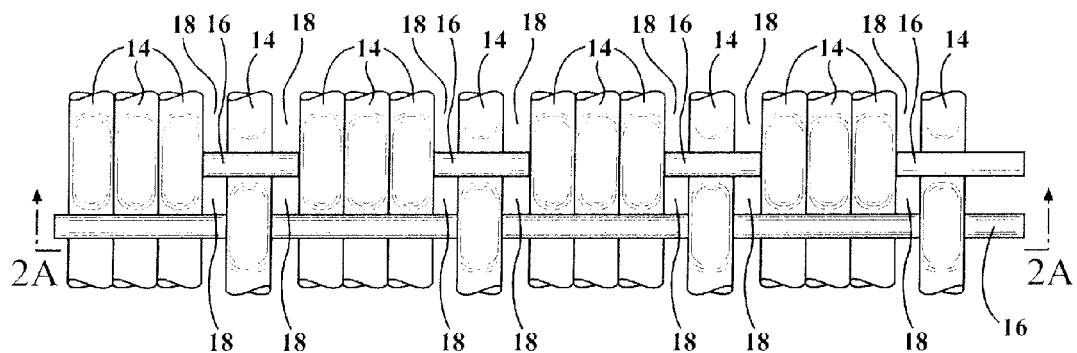
FIG. 2A
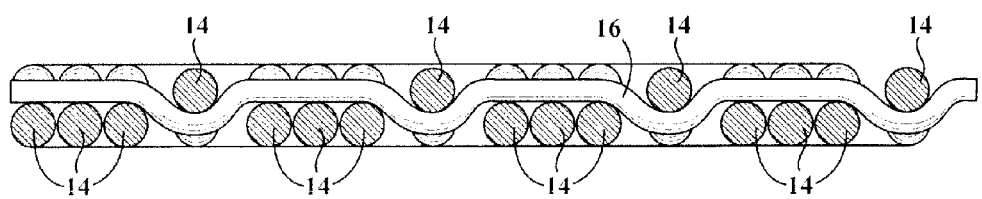

EMI SHIELDING TEXTILE FABRIC, WRAPPABLE SLEEVE CONSTRUCTED THEREFROM AND METHOD OF CONSTRUCTION THEREOF

BACKGROUND OF THE INVENTION

1. Technical Field

This invention relates generally to textile fabrics for providing protection against electromagnetic interference, and more particularly to woven fabrics for protecting electrical members against electromagnetic interference.

2. Related Art

It is known to wrap electrical members, such as wires and wire harnesses, in textile protective sleeves, such as in automobiles, aircraft or aerospace craft, to provide protection to the wires against electromagnetic interference (EMI). In order to achieve the desired protection, considerations need to be given to the type of EMI protection desired, whether high frequency EMI, low frequency EMI, or both. In textile sleeves, such as woven sleeves, openings, also referred to as holes, are inherently formed in a wall of the sleeve between adjacent and overlapping yarns. The holes ultimately result in the passage of high frequency EMI as well as potentially diminishing the total conductivity provided by yarns of the sleeve wall, which in turn can affect the ability of the wall to provide the desired shielding against low frequency EMI, particularly if the number of holes formed between overlapping yarns is high.

SUMMARY OF THE INVENTION

In accordance with one aspect of the invention, a textile fabric for routing and protecting an electrical member against electromagnetic interference is provided. The fabric forms an elongate wall constructed from lengthwise extending warp yarns woven with widthwise extending weft yarns. At least some of the warp yarns are electrically conductive and have a first diameter. The weft yarns have a second diameter that is at least 25 percent less than the first diameter of the warp yarns. As such, upon weaving the fabric, the conductive warp yarns are brought into closer proximity with one another than if the weft yarns were the same diameter as the warp yarns. Accordingly, the ability of the fabric to provide shielding protection against EMI is enhanced.

In accordance with a further aspect of the invention, a plurality of the weft yarns of the fabric are heat-settable polymeric yarn, wherein the plurality of heat-settable polymeric yarns can be heat-set to bias the wall into a self-wrapping configuration to bring opposite lengthwise extending edges into overlapping relation with one another to provide a generally tubular cavity in which an electrical member can be disposed for protection therein.

In accordance with a further aspect of the invention, the warp yarns are woven to skip over at least 3 of the weft yarns thereby resulting in fewer openings formed between intersecting weft and warp yarns in comparison to a plain weave pattern, thereby resulting in enhanced protection against EMI.

In accordance with a further aspect of the invention, a woven textile sleeve for protecting an electrical member contained therein against EMI is provided. The sleeve includes an elongate wall having opposite edges wrappable in overlapping relation with one another to form an enclosed cavity extending along a central axis between opposite ends. The wall has warp yarns extending generally parallel to the central axis woven with weft yarns extending transversely to the warp yarns. At least some of the warp yarns are electrically conductive and have a first diameter and the weft yarns have a second diameter at least 25 percent less than the first diameter, thereby resulting in reduced size opening between intersecting weft and warp yarns, which in turns enhances the ability of the sleeve to provide protection against EMI to an electrical member disposed in the sleeve.

In accordance with a further aspect of the invention, at least some of the weft yarns in the sleeve wall are heat-set to bias the opposite edges in overlapping relation with one another.

In accordance with a further aspect of the invention, a method of constructing a fabric for protecting an electrical member against electromagnetic interference is provided. The method includes forming an elongate wall by weaving lengthwise extending warp yarns with widthwise extending weft yarns, with at least some of the warp yarns being electrically conductive and having a first diameter and with the weft yarns having a second diameter that is at least 25 percent less than the first diameter.

In accordance with a further aspect of the invention, the method can further include weaving the wall of the fabric having a satin weave pattern.

In accordance with a further aspect of the invention, a method of constructing a textile sleeve for protecting an electrical member contained therein against EMI is provided. The method includes forming an elongate wall having opposite edges extending along a central axis between opposite ends by weaving warp yarns extending generally parallel to the central axis woven with weft yarns extending transversely to the warp yarns, with at least some of the warp yarns being electrically conductive and having a first diameter and the weft yarns having a second diameter being at least 25 percent less than the first diameter. Further, wrapping the wall to bring the opposite edges in overlapping relation with one another.

In accordance with a further aspect of the invention, the method of constructing the sleeve can further include heat-setting at least some of the weft yarns to bias the opposite edges in overlapping relation with one another.

In accordance with a further aspect of the invention, the method of constructing the sleeve can further include weaving the wall having a satin weave pattern.

BRIEF DESCRIPTION OF THE DRAWINGS

These and other aspects, features and advantages will become readily apparent to those skilled in the art in view of the following detailed description of presently preferred embodiments and best mode, appended claims, and accompanying drawings, in which:

FIG. 1 is a schematic plan view of a textile EMI shielding fabric woven in accordance with one aspect of the invention;

FIG. 2 is an enlarged fragmentary plan view of the fabric of FIG. 1 woven in accordance with another aspect of the invention;

FIG. 2A is a side view of the fabric of FIG. 2;

DETAILED DESCRIPTION OF PREFERRED EMBODIMENTS

Figure 3:
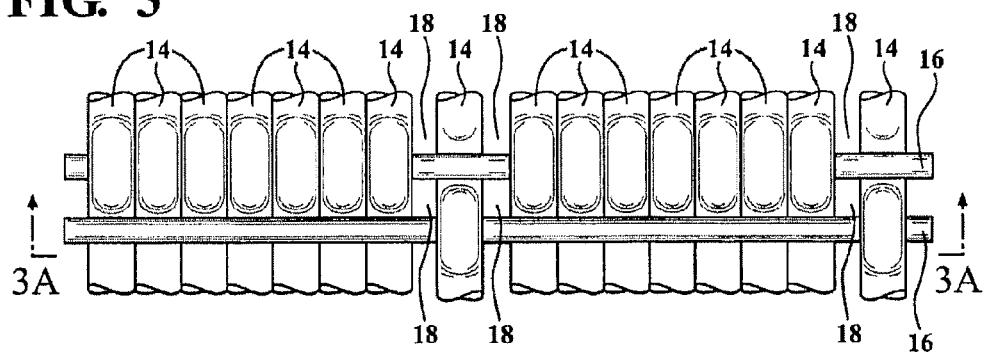
FIG. 3 is an enlarged fragmentary plan view of the fabric of FIG. 1 woven in accordance with yet another aspect of the invention.
Figure 3A:
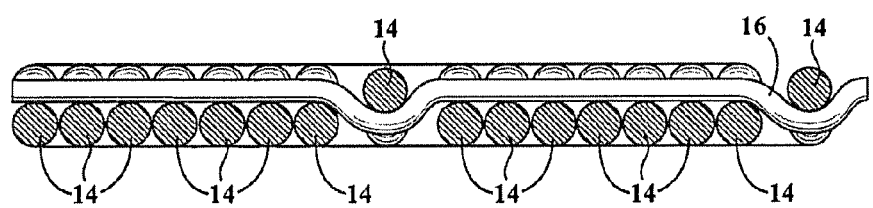
FIG. 3A is a side view of the fabric of FIG. 3.

Referring in more detail to the drawings, FIG. 1 shows a plan view of textile fabric 10 constructed in accordance with one aspect of the invention. The fabric 10 is constructed as an elongate wall 12 from lengthwise extending warp yarns 14 woven with widthwise extending weft yarns 16. At least some, a plurality, or all of the warp yarns 14 are electrically conductive and have a first diameter and the weft yarns 16 have a second diameter, wherein the second diameter is at about, and preferably at least 25 percent less than the first diameter. As such, upon weaving the fabric 10, the conductive warp yarns 14 are brought into closer proximity with one another than if the weft yarns 16 were the same size as the warp yarns 14, thereby enhancing the ability of the fabric 10 to provide shielding protection against EMI.

The fabric 10 can be woven in a plain weave pattern, however, this results in an increased number of openings 18 (with 2 opening being created at each intersection of the weft and warp yarns undulating over and under one another). As such, it is preferred that a satin weave pattern be used, such as a crows foot satin weave (FIG. 2A) or an 8 harness satin weave pattern (FIG. 2B), or any other type of satin weave pattern, thereby resulting in fewer openings 18 in comparison with a plain weave pattern. It has been found that the number of openings 18 can affect the total conductivity over a fabric surface, with the fewer number of openings formed typically resulting in enhanced conductivity, thereby resulting in enhanced protection against EMI.

The conductive warp yarns 14 are provided as hybrid yarns formed of nonconductive monofilament and/or nonconductive multifilament filaments or members, referred to hereafter simply as nonconductive members 20, unless otherwise specified, twisted and/or served with strands of micron-sized continuous conductive wire filaments, referred to hereafter simply as wire filaments 22.

The nonconductive members 20, in one presently preferred embodiment, are provided as multi-filamentary yarns, also referred to as multifilaments, which provides a soft texture. Depending on the application, the nonconductive members 20, whether multifilaments or monofilaments, as discussed in more detail hereafter, can be formed from, by way of example and without limitation, polyester, nylon, polypropylene, polyethylene, acrylic, cotton, rayon, and fire retardant (FR) versions of all the aforementioned materials when extremely high temperature ratings are not required. If higher temperature ratings are desired along with FR capabilities, then the nonconductive members 20 could be constructed from, by way of example and without limitation, materials including m-Aramid (sold under names Nomex, Conex, Kermel, for example), p-Aramid (sold under names Kevlar, Twaron, Technora, for example), PEI (sold under name Ultem, for example), PPS, LCP, TPFE, and PEEK. When even higher temperature ratings are desired along with FR capabilities, the nonconductive members 20 can include mineral yarns such as fiberglass, basalt, silica and ceramic, for example.

Figure 4:
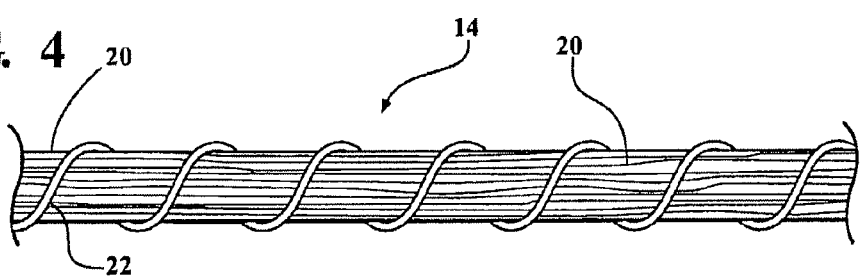
FIG. 4 is an enlarged side view of a hybrid yarn used in the construction of the fabric of FIG. 1.
Figure 5:
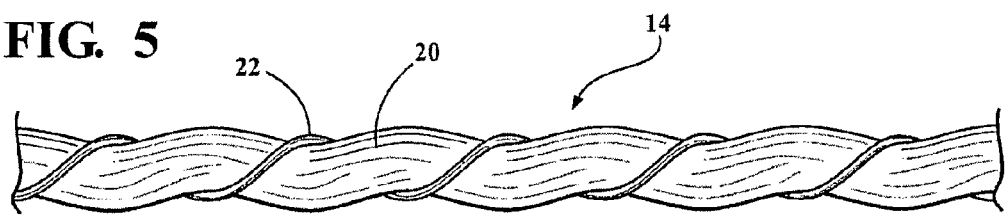
FIG. 5 is an enlarged side view of another hybrid yarn used in the construction of the fabric of FIG. 1.

As mentioned, the continuous conductive wire filaments 22 can be either served with the nonconductive member 20, such as shown in FIG. 4, for example, such that the nonconductive member 20 extends along a generally straight path, while the conductive wire filament 22 extends along a helical path about the nonconductive member 20, or twisted with the nonconductive members 20, such as shown in FIG. 5, for example, such that they form axially offset helical paths relative to one another. Regardless of how constructed, it is preferred that at least a portion of the conductive wire filaments 22 remain or extend radially outward of an outer surface of the nonconductive members 20. This facilitates maintaining effective EMI, RFI and/or ESD shielding properties of the fabric 10 constructed at least in part from the hybrid warp yarns 14. The conductive wire filaments 22 are preferably provided as continuous strands of stainless steel, such as a low carbon stainless steel, for example, SS316L, which has high corrosion resistance properties, however, other conductive continuous strands of metal wire could be used, such as, copper, tin or nickel plated copper, aluminum, and other conductive alloys, for example.

Figure 6:
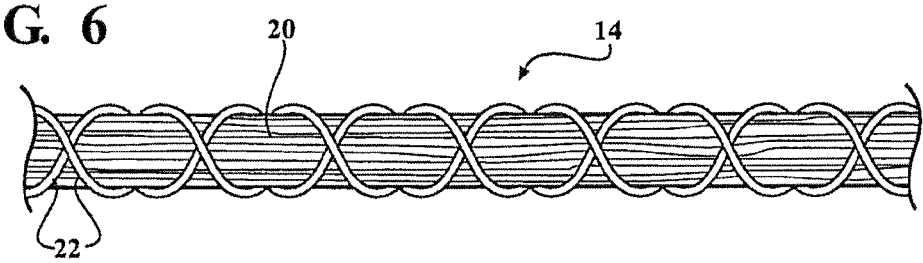
FIG. 6 is an enlarged side view of yet another hybrid yarn used in the construction of the fabric of FIG. 1.
Figure 7:
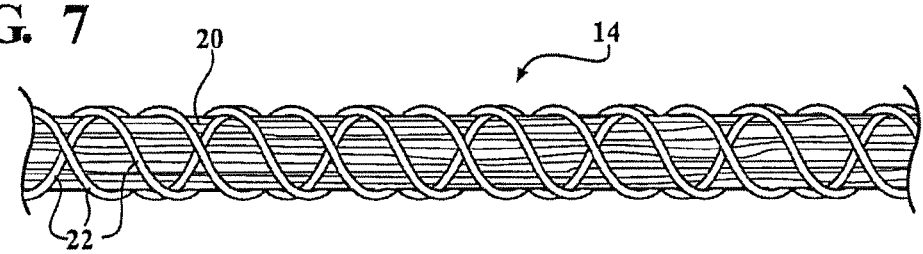
FIG. 7 is an enlarged side view of yet another hybrid yarn used in the construction of the fabric of FIG. 1.

The continuous conductive wire filaments 22 can overlie the nonconductive member or members 20 by being twisted or served about the nonconductive members 20 to form the hybrid yarn 18 having a single strand conductive wire filament 22 (FIGS. 4, 5 and 8), a plurality of conductive wire filaments 22, shown as two strands of conductive wire filaments 22 (FIGS. 6, 9-12), three strands of conductive wire filaments 22 (FIGS. 7 and 13), or more, as desired, extending substantially along the length of the hybrid warp yarn 14. It should be recognized that any desired number of conductive wire filaments 22 can be used, depending on the shielding sought, with the idea that an increased number of conductive wires along the length of the hybrid yarn 18 generally increases the shielding potential. When two or more conductive wire filaments 22 are used, they can be arranged to cross over one another, such as, by way of example and without limitation, by having different helical angles and/or by twisting or serving the wire filaments 22 in opposite helical directions, as shown in FIGS. 6 and 7, or they can be configured in non-overlapping relation with one another by having similar helical angles and by being twisted or served in the same helical direction, such as shown in FIGS. 9-13, for example.

Figure 8:
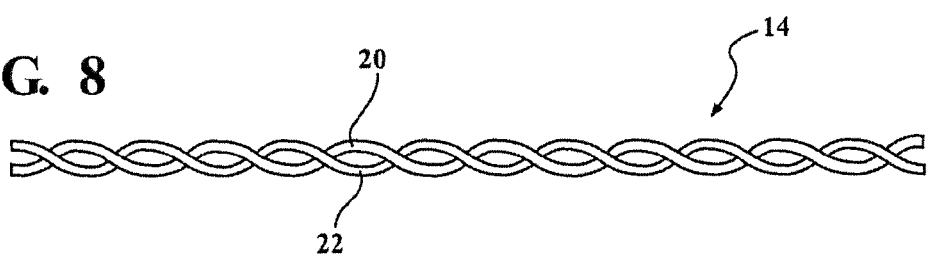
FIG. 8 is an enlarged side view of yet another hybrid yarn used in the construction of the fabric of FIG. 1.

As shown in FIG. 8, a hybrid warp yarn 14 is constructed by serving, or as shown, twisting a single conductive wire filament 22 with a single nonconductive filament 20, shown here as being a monofilament formed from one of the aforementioned materials.

Figure 9:
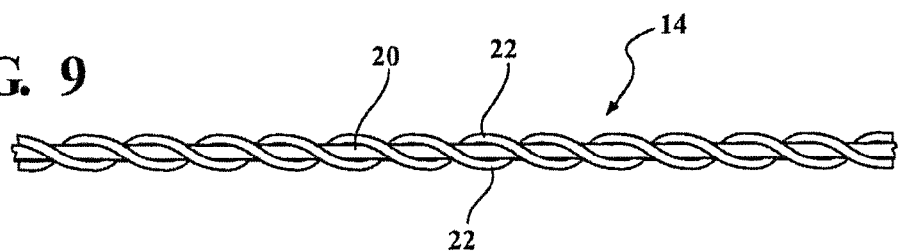
FIG. 9 is an enlarged side view of yet another hybrid yarn used in the construction of the fabric of FIG. 1.

As shown in FIG. 9, a hybrid warp yarn 14 is constructed by serving two or more conductive wire filaments 22 about a single nonconductive filament, shown here as a nonconductive monofilament 20. As shown, the wire filaments 22 in this embodiment are served in the same direction with one another having substantially the same helix angle, and thus, do not overlap one another.

Figure 10:
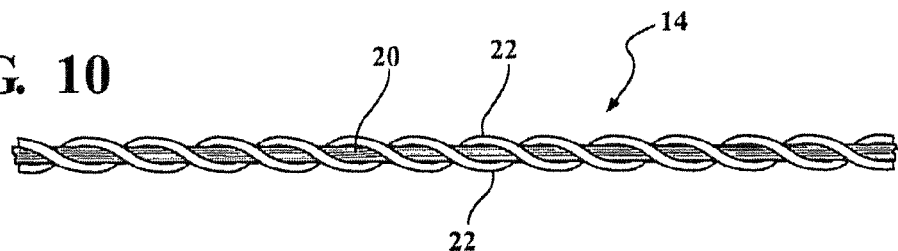
FIG. 10 is an enlarged side view of yet another hybrid yarn used in the construction of the fabric of FIG. 1.

As shown in FIG. 10, a hybrid warp yarn 14 is constructed by serving two or more conductive wire filaments 22 about a single nonconductive filament 20. However, rather than serving them about a monofilament, as in FIG. 9, the wire filaments 22 are served about a multifilament 20.

Figure 11:
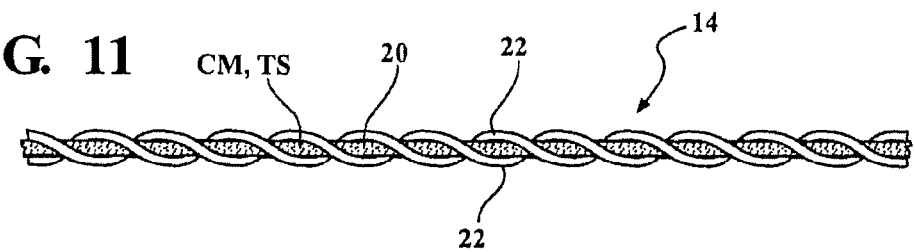
FIG. 11 is an enlarged side view of yet another hybrid yarn used in the construction of the fabric of FIG. 1.

As shown in FIG. 11, a hybrid warp yarn 14 is constructed generally the same as described above and shown in FIGS. 9 and 10 by serving two or more conductive wire filaments 22 about a single nonconductive filament, shown here as a nonconductive monofilament 20. However, prior to serving the conductive wire filaments 22 about the nonconductive filament 20, the nonconductive monofilament 20 is either treated by first applying and adhering a coating material CM to its outer surface, or the outer surface has a texturized surface TS provided thereon in a texturizing process. The coating material CM or texturized surface TS acts to inhibit the conductive wire filaments 22 from slipping relative to the underlying nonconductive monofilament 20.

Figure 12:
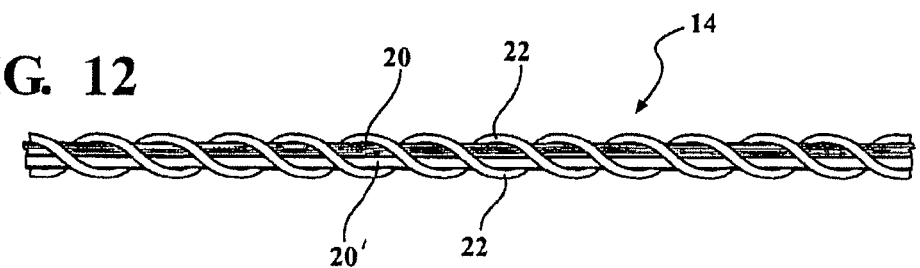
FIG. 12 is an enlarged side view of yet another hybrid yarn used in the construction of the fabric of FIG. 1.
Figure 13:
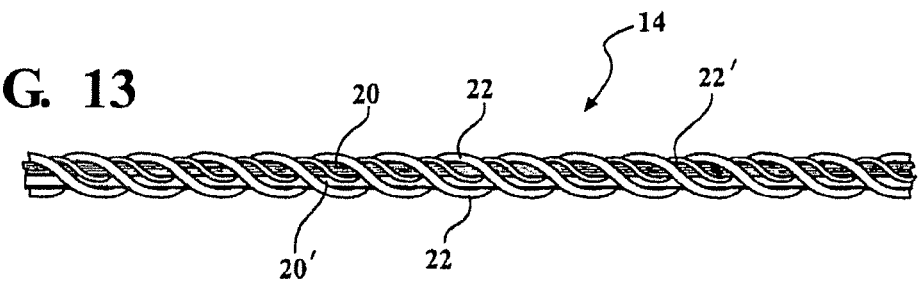
FIG. 13 is an enlarged side view of yet another hybrid yarn used in the construction of the fabric of FIG. 1.

As shown in FIG. 12, a hybrid warp yarn 14 is constructed by serving two or more conductive wire filaments 22 about a pair of nonconductive filaments 20, 20'. The nonconductive filaments 20, 20' are represented here as being a nonconductive multifilament 20 and a nonconductive monofilament 20', provided from the aforementioned materials. The nonconductive multifilament 20 and monofilament 20' substantially abut one another along their lengths. Further, as shown in FIG. 13, a hybrid warp yarn 14 constructed in accordance with yet another presently preferred aspect of the invention has at least one of the nonconductive members, shown here as the multifilament nonconductive member 20, provided as a hybrid yarn, such as shown as discussed above with regard to FIG. 3, having another conductive wire filament 22' twisted or served thereabout, though any of the other previously described and illustrated embodiments of the hybrid warp yarn 14 could be used. Accordingly, at least one of the continuous conductive wire filaments 22' extends solely about the nonconductive multifilament 20.

Figure 14:
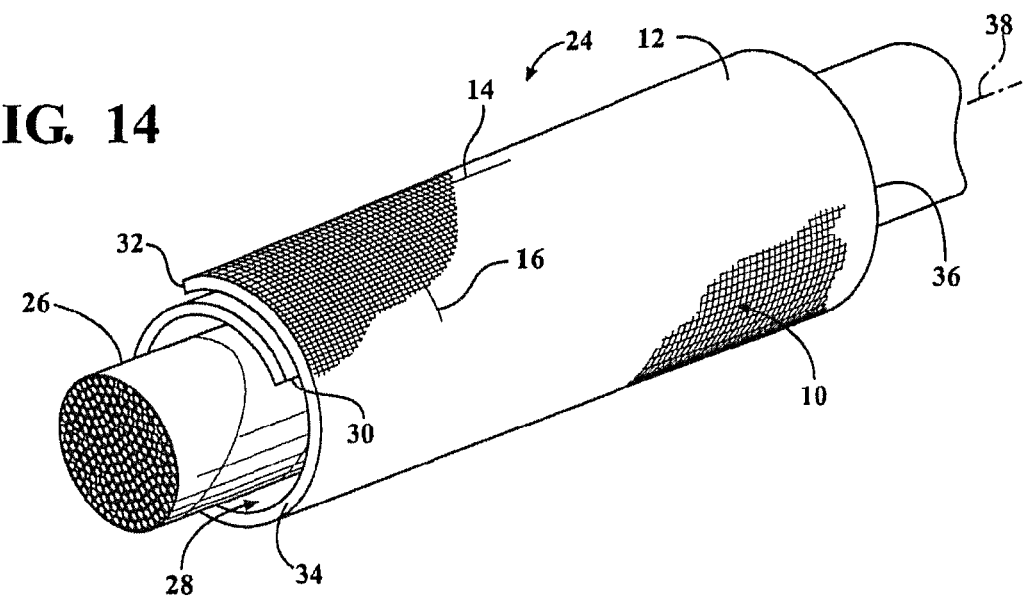
FIG. 14 is a perspective view of a wrappable sleeve constructed from a woven fabric in accordance with another aspect of the invention.

In FIG. 14, the fabric 10 of FIG. 1, woven via any of the aforementioned and illustrated weave patterns with the aforementioned weft and warp yarns 14, 16, is shown wrapped as a tubular sleeve 24 for protecting an elongate electrical member, e.g. wire or wire harness 26, within a circumferentially enclosed cavity 28 thereof. The wall 12 of the sleeve 24 can be formed as a self-wrapping elongate wall 12, upon heat-forming the heat-settable weft yarns 16. As such, when the wall 12 is in its self-wrapped tubular configuration, generally free from any externally applied forces, opposite lengthwise extending edges 30, 32, which extend generally parallel to a longitudinal central axis 34 between opposite ends 34, 36 of the sleeve 24, overlap one another at least slightly to fully enclose the cavity 28 circumferentially, and thus, the wall 12 provides enhanced protection to the wires 26 contained in the cavity 28 against EMI about a full circumference of the wall 12. The sides 30, 32 are readily extendable away from one another under an externally applied force to at least partially open and expose the cavity 28. Accordingly, the wires 26 can be readily disposed into the cavity 28 during assembly or removed from the cavity 28 during service. Upon releasing the externally applied force, the edges 30, 32 return automatically under a bias imparted within the polymeric heat-settable weft yarns 16 as a result of being heat-set in their curled configuration.

In accordance with another aspect of the invention, a method of constructing a textile fabric and a protective sleeve therefrom for routing and protecting an electrical member against electromagnetic interference is provided.

The method includes weaving a wall 12 from lengthwise extending warp yarns 14 and widthwise extending weft yarns 16, with at least some of the warp yarns 14 being electrically conductive and having a first diameter and the weft yarns having a second diameter at least 25 percent less than the first diameter. With the diameter of the weft yarns 16 being less than the diameter of the warp yarns 14, the size of the openings 18 formed at the over and underlying intersection of the warp and weft yarns 14, 16 is reduced, thereby minimizing the amount of pass through of EMI through the wall 12.

In accordance with a further aspect of the method of construction, the woven wall 12 can be woven in a satin weave pattern, thereby reducing the total number of openings 18 formed via over and underlying intersection of the warp and weft yarns 14, 16. As such, having a reduced total number of openings 18 further reduces the amount of pass through of EMI through the wall 12.

In accordance with a further aspect of the method of construction, the wall 12 can be wrapped to bring opposite lengthwise extending edges 30, 32 into overlapping relation with one another to construct a sleeve 24 for protecting an electrical member in a cavity 28 thereof.

In accordance with a further aspect of the method of construction, the wall 12 can be heat-set to form a self-wrapping sleeve 24 via heat-setting polymeric weft yarns 16 to take-on a biased, curled configuration.

In accordance with a further aspect of the method of construction, the conductive warp yarns can be provided including a conductive wire extending about a non-conductive yarn, as shown in FIGS. 4-13 and as discussed above.

Obviously, many modifications and variations of the present invention are possible in light of the above teachings. It is, therefore, to be understood that within the scope of the appended claims, the invention may be practiced otherwise than as specifically described.

What is claimed is:

1. A textile fabric for routing and protecting an electrical member against electromagnetic interference, comprising:
an elongate wall constructed from lengthwise extending warp yarns woven with widthwise extending weft yarns, at least some of said warp yarns being electrically conductive and having a first diameter and said weft yarns having a second diameter, said second diameter being at least 25 percent less than said first diameter.

2. The textile fabric of claim 1 wherein a plurality of said weft yarns are heat-settable polymeric yarn.

3. The textile fabric of claim 2 wherein said plurality of heat-settable polymeric yarns are heat-set to bias said wall into a self-wrapping configuration about a longitudinal central axis.

4. The textile fabric of claim 3 wherein said wall has opposite lengthwise extending edges that are biased in overlapping relation with one another by said heat-set yarns to provide a generally tubular cavity in which the member is received.

5. The textile fabric of claim 2 wherein a plurality of said warp yarns include a conductive wire extending about a non-conductive yarn.

6. The textile fabric of claim 1 wherein said warp yarns are woven to skip over at least 3 of said weft yarns.

7. The textile fabric of claim 6 wherein said warp yarns are woven in a satin weave.

8. The textile fabric of claim 6 wherein said satin weave is an 8 harness satin weave.

9. A woven textile sleeve for protecting an electrical member contained therein against EMI, comprising:

an elongate wall having opposite edges wrappable in overlapping relation with one another to form an enclosed cavity extending along a central axis between opposite ends, said wall having warp yarns extending generally parallel to said central axis woven with weft yarns extending transversely to said warp yarns, at least some of said warp yarns being electrically conductive and having a first diameter and said weft yarns having a second diameter, said second diameter being at least 25 percent less than said first diameter.

10. The woven textile sleeve of claim 9 wherein at least some of said weft yarns are heat-set to bias said opposite edges into overlapping relation with one another.

11. The woven textile sleeve of claim 9 wherein said wall is woven having a satin weave.

12. The woven textile sleeve of claim 9 wherein said conductive warp yarns include a conductive wire extending about a non-conductive yarn.

13. A method of constructing a fabric for protecting an electrical member against electromagnetic interference, comprising:

forming an elongate wall by weaving lengthwise extending warp yarns with widthwise extending weft yarns, with at least some of the warp yarns being electrically conductive and having a first diameter and with the weft yarns having a second diameter that is at least 25 percent less than the first diameter.

14. The method of claim 13 further including weaving the wall having a satin weave pattern.

15. A method of constructing a textile sleeve for protecting an electrical member contained therein against EMI, comprising:

forming an elongate wall having opposite edges extending along a central axis between opposite ends by weaving warp yarns extending generally parallel to the central axis woven with weft yarns extending transversely to the warp yarns, with at least some of the warp yarns being electrically conductive and having a first diameter and the weft yarns having a second diameter being at least 25 percent less than the first diameter; and wrapping the wall to bring the opposite edges in overlapping relation with one another.

16. The method of claim 15 further including heat-setting at least some of the weft yarns to bias the opposite edges in overlapping relation with one another.

17. The method of claim 15 further including weaving the wall having a satin weave pattern.

* * * * *